United States Patent [19]

Possin et al.

[11] Patent Number: 5,324,674
[45] Date of Patent: Jun. 28, 1994

[54] FABRICATION METHOD FOR A SELF-ALIGNED THIN FILM TRANSISTOR HAVING REDUCED END LEAKAGE AND DEVICE FORMED THEREBY

[75] Inventors: George E. Possin; Ching-Yeu Wei, both of Schenectady, N.Y.

[73] Assignee: General Electric Company, Schenectady, N.Y.

[21] Appl. No.: 43,999

[22] Filed: Apr. 5, 1993

Related U.S. Application Data

[62] Division of Ser. No. 862,125, Apr. 2, 1992, Pat. No. 5,241,192.

[51] Int. Cl.$^5$ ............................................. H01L 21/265
[52] U.S. Cl. .................................... 437/41; 437/909; 437/101
[58] Field of Search ................. 437/40, 41, 101, 909

[56] References Cited

U.S. PATENT DOCUMENTS

| | | | |
|---|---|---|---|
| 5,010,027 | 4/1991 | Possin et al. | 437/41 |
| 5,075,244 | 12/1991 | Sakai et al. | 437/41 |
| 5,112,764 | 5/1992 | Mitra et al. | 437/40 |
| 5,166,085 | 11/1992 | Wakai et al. | 437/40 |

*Primary Examiner*—George Fourson
*Assistant Examiner*—Richard A. Booth
*Attorney, Agent, or Firm*—Donald S. Ingraham; Marvin Snyder

[57] ABSTRACT

A thin film transistor (TFT) having reduced end leakage is fabricated by: forming a gate electrode on a substrate; forming a TFT body disposed over the gate electrode, the TFT body comprising an intrinsic semiconductor material layer, a channel plug disposed on the intrinsic semiconductor material layer over the gate electrode, a doped semiconductor material layer on the intrinsic semiconductor material and the sidewalls of the channel plug, and a source/drain metallization layer; selectively etching the source/drain metallization layer to form an address connection line and a pixel connection line to a respective source electrode tip and drain electrode tip, selectively etching the channel plug to remove the portion of the sidewalls not adjoining the source and electrode tips that had been in contact with the doped semiconductor layer; removing the doped semiconductor layer portion not underlying the address connection line, the pixel connection line, and the source and drain electrode tips; and removing the now-exposed portion of the intrinsic semiconductor layer material that had been in contact with the doped semiconductor material.

12 Claims, 4 Drawing Sheets

FABRICATION METHOD FOR A SELF-ALIGNED THIN FILM TRANSISTOR HAVING REDUCED END LEAKAGE AND DEVICE FORMED THEREBY

This application is a division of application Ser. No. 07/862,125, filed Apr. 2, 1992 now U.S. Pat. No. 5,241,192.

FIELD OF THE INVENTION

The present invention relates to thin-film field-effect transistors and, more particularly, to a method for fabricating a self-aligned field-effect transistor having reduced end leakage.

BACKGROUND OF THE INVENTION

Thin film transistors (TFTs) are used extensively in electronic display and detection systems. For example, TFTs are commonly used to rapidly switch individual pixels on and off in large area imaging devices, large area liquid crystal displays, and solid state radiation imagers. In such devices each pixel can be individually addressed through the use of scan and data lines and a TFT associated with each pixel; the scan line is typically coupled to the gate of the TFT to cause it to become conductive or non-conductive while the source/drain electrodes are connected to couple the data line to the pixel when the TFT is conductive.

Each imager array may include many thousands of pixels. It is important for efficient electrical functioning of the array that each TFT switching device operate within known parameters, allowing use of relatively low voltage control signals to switch the devices on and off rapidly with a minimum of associated electronic noise. One important factor affecting imager array performance is the source/drain-to-gate (S/D-G) capacitance of the TFTs in the array. The S/D-G capacitance is determined in large part by the source and drain electrodes overlap of the gate electrode; excessive overlap results in an excessive S/D-G capacitance, while too much spatial separation between the source/drain and gate electrodes can result in high on-resistances and too-high saturation drain currents.

It is desirable to use a self-alignment technique in fabricating a TFT (or more particularly, an array of TFTs) to ensure that the channel gap between the source and the drain electrodes is optimized and is substantially uniform for each TFT in the array. An efficacious TFT self-alignment fabrication technique is disclosed by G. Possin and C. Wei in U.S. Pat. No. 5,010,027, issued Apr. 23, 1991 (the "'027 patent"). This patent is assigned to the assignee of the present invention and is incorporated herein by reference. As is disclosed by the '027 patent, a channel plug made of an insulative material and having selected dimensions is disposed over the gate electrode on the semiconductive layer. The dimensions of the channel plug determine the extent to which the source and drain electrode tips overlap the underlying gate electrode. In the assembled device, the tips of the source and drain electrode extending over the gate electrode are separated from the channel plug by a relatively thin layer of a doped semiconductive material.

Another factor in TFT performance is end leakage of the device. End leakage refers to the undesired current paths remaining along the ends of the channel plug and ends of the underlying semiconductive layers which are not adjacent to the source or drain electrodes. Such current leakage adversely affects array performance in that control currents to turn the TFT on or off may need to be increased. Further, the minimum leakage current may be too large to be employed in some types of arrays. High leakage may reduce the charge or voltage below a minimum operational level on the pixel element during the relatively long time periods between successive connections (via the TFT) of the pixel to the bus line. For example, the TFT is switched to connect the bus line to the pixel to set the voltage in a liquid crystal device or to read the pixel charge in an imaging device.

End leakage in self-aligned TFTs, such as those fabricated in accordance with the method disclosed in the '027 patent, may arise when residual doped semiconductor material adheres to the channel plug end sides (i.e., the sidewalls of the channel plug that extend between the respective tips of the source and drain electrodes) and when a portion of the semiconductive layer sidewalls underlying (or in the vicinity of and substantially aligned with) the channel plug end sides is contaminated with dopant from the doped semiconductive material used in the fabrication process. In both of these situations, the contaminating material that is the source of the end leakage is not readily removed in the normal fabricating steps due to its location along the substantially vertical sidewalls of the channel plug and underlying semiconductive layer.

It is therefore an object of this invention to provide a method of fabricating a TFT that results in reduced end leakage in the fabricated device.

A further object of this invention is to provide a fabrication method that removes portions of the TFT channel plug end sides that had been in contact with the doped semiconductive material during the fabrication process.

Another object of the invention is to provide a fabrication method that removes portions of the semiconductive layer in the vicinity of the channel plug end sides that had been in contact with the doped semiconductive layer.

A yet further object of the invention is to provide a TFT exhibiting relatively low end leakage currents.

SUMMARY OF THE INVENTION

A method of fabricating a thin film transistor (TFT) includes the steps of forming a gate electrode on a substrate; forming a TFT body disposed over the gate electrode, the TFT body having a first insulation material layer, a substantially intrinsic semiconductor material layer, a channel plug disposed on the intrinsic semiconductor material layer and made of an insulating material having selected dimensions, a doped semiconductor material layer, and a source/drain metallization layer shaped to form source and drain electrode tips disposed a selected overlap distance over the gate; etching the source/drain metallization layer to form address and pixel connection lines respectively to the source and drain electrode tips; removing portions of the channel plug end sidewalls that formerly had been in contact with the doped semiconductor material layer; removing the doped semiconductor material layer except where it underlies the remaining source and drain electrode metallization; and removing at least the portion of the intrinsic semiconductor material layer that formerly had been in contact with the doped semiconductor material, which portion is exposed by the removal of the doped semiconductor material.

The step of removing the end sides of the channel plug preferably includes the steps of forming a mask over the channel plug to cover at least the portion of the channel plug and the adjoining doped semiconductor material disposed between the source and the drain electrode tips, and portions of the source/drain metallization layer. This mask is then also used in the etching of the source/drain metal to form the address and pixel connection lines in a step that can take place either before or after etching the channel plug ends. The insulation material comprising the channel plug is advantageously silicon nitride, silicon oxide, or a combination of layers of these materials, and the etching of the channel plug end sides is preferably done with hydrofluoric acid or buffered hydrofluoric acid. Reactive ion etching is advantageously used for the etching of the doped semiconductor material and intrinsic semiconductor material.

A TFT formed in accordance with the method of this invention has a TFT body with a channel plug disposed over the gate electrode finger such that the source and drain electrode tips are disposed a selected overlap distance over the gate electrode finger. The channel plug end sidewalls are substantially aligned with the sides of the address and pixel connection lines and disposed such that substantially no residual doped semiconductor material adheres to the channel plug end sidewalls. The intrinsic semiconductor layer underlying the channel plug further has channel gap sidewalls (extending under the channel plug between the source and drain electrode tips) that are also substantially aligned with the sides of the address and pixel connection lines and disposed such that substantially no residual doped semiconductor material adheres thereto.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE PRIOR ART

Figure 1A:
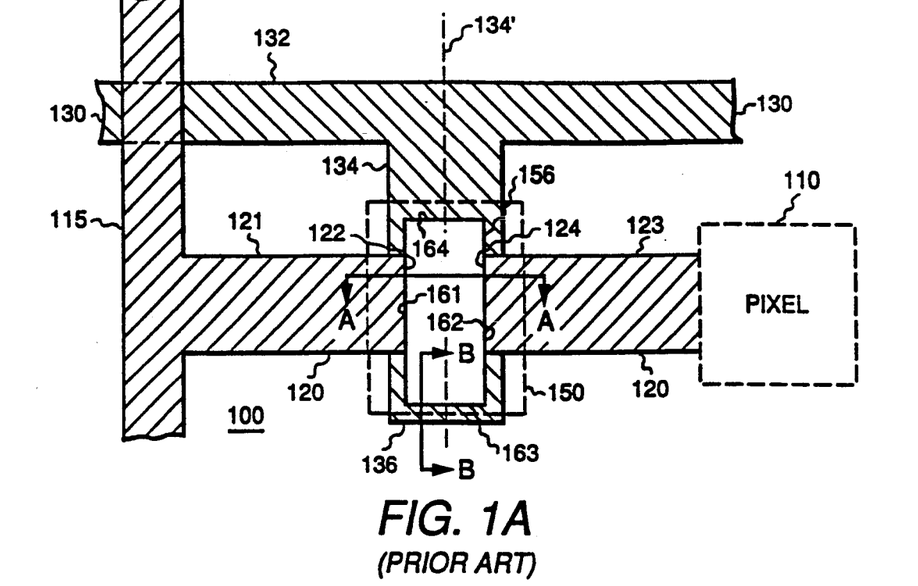
FIG. 1A is a plan view showing a portion of a thin film transistor (TFT) array following formation of a TFT body in accordance with the prior art.

FIG. 1A illustrates a portion of an array 100 of pixels and associated electrical connections to the pixels fabricated in accordance with the prior art. The portion of the array depicted is representative of the whole array. The array comprises a pixel 110, a data line bus 115, a source/drain address line 120, a gate electrode 130, and a TFT 150. The gate electrode and the source/drain address line are also commonly referred to as scan and data lines, respectively.

Gate electrode 130 comprises a gate address line 132 and a gate electrode finger 134 extending substantially perpendicularly from the gate address line along a longitudinal axis 134'. The gate electrode finger terminates in a gate electrode tip 136. In the assembled device, the source/drain address line comprises an address connection line 121 extending from data line bus 115 and terminating in a source electrode tip 122, and a pixel connection line 123 extending between a drain electrode tip 124 and pixel 110. For TFTs used as control switches in arrays as described herein, the nomenclature for the source and drain electrodes is somewhat arbitrary, and the designation of one electrode tip as the source and one as the drain is primarily used to aid in the description of the device.

As discussed in U.S. Pat. No. 5,010,027, the self-aligned fabrication process preferably allows for fabricating the source electrode tip and the drain electrode tip such that the tips are precisely positioned at a desired overlap distance over gate electrode finger 134. For example, a channel plug 156 having dimensions selected to produce the desired overlap of the source and drain electrode tips is advantageously disposed over the gate electrode finger, as illustrated in FIG. 1A. The self aligned planarization method described in the '027 patient allows the source and drain electrode tips to be positioned within a selected overlap of the gate electrode without concern for mask alignment error. Thus, address connection line 121 and pixel connection line 123 can be readily fabricated after the electrode tips are formed, and the process for fabricating these lines does not require the precise alignment of a mask, such as is required in conventional, non-self-aligned methods for forming the electrode tips with the same mask used for the connection lines. Pixel 110 comprises the electronic component used to perform the array function. For example, in a display device pixel 110 may comprise a liquid crystal device; alternatively, in a radiation imager it may comprise a photodetector.

Figure 1B:
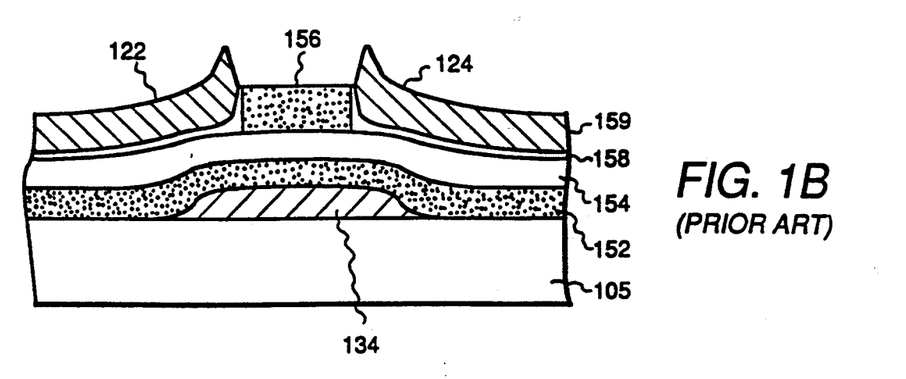
FIG. 1B is a cross-sectional view of the TFT body formed in accordance with the prior art, taken along line A—A in FIG. 1A.

FIG. 1B illustrates a cross-sectional view of TFT body 150 produced by the fabrication process of the prior art as disclosed in the '027 patent. The TFT body is disposed on a substrate 105 and comprises gate electrode finger 134, a first insulation material layer 152, a substantially intrinsic semiconductor material layer 154, a channel plug 156; a doped semiconductor material layer 158, and a source/drain metallization layer 159. Channel plug 156 comprises an insulative material such as silicon nitride, silicon oxide, and the like, or alternatively multiple layers of such insulative material. The channel plug is deposited on the intrinsic semiconductor material layer and is disposed over at least a portion of gate electrode finger 134.

As illustrated in FIG. 1A, channel plug 156 has a substantially rectangular block shape at the conclusion of the fabrication process. Channel plug 156 comprises two channel plug electrode sidewalls 161, 162 which are disposed on opposite sides of the channel plug and substantially aligned with a longitudinal axis 134' of gate electrode finger 134, and two channel plug end sidewalls 163, 164 disposed at the ends of the channel plug that do not adjoin source and drain electrode tips 122, 124; these channel plug end sidewalls are oriented substantially perpendicular to longitudinal axis 134' of the gate electrode finger. As is illustrated in FIGS. 1A and 1B, doped semiconductor material layer 158 underlies source/drain metallization layer 159, which is patterned to form data line 115 and source/drain address line 120. The doped semiconductor layer is disposed over the intrinsic semiconductor material layer and extends up the channel plug sidewalls. First insulation material layer 152, intrinsic semiconductor material layer 154, doped semiconductor material layer 158, and source/drain metallization layer 159 are typically deposited so that these layers extend across the gate electrode and the substrate away from the TFT body. Portions of layers 154, 158, and 159 are etched away to form the source/drain address lines with the cross-sectional structure illustrated in FIG. 1B, with the remainder of the array remaining substantially covered by first insulation material layer 152.

Figure 1C:
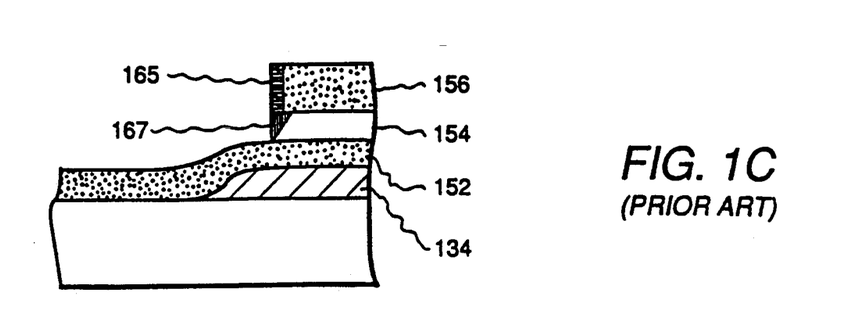
FIG. 1C is a cross-sectional view of a portion of the TFT body showing the channel plug end sides when formed in accordance with the prior art, taken along line B—B in FIG. 1A.

FIG. 1C illustrates a cross section of TFT body 150, formed in accordance with the fabrication technique of the prior art, across the channel plug end sidewall 163 along line B—B in FIG. 1A. The structure in proximity to channel plug end sidewall 164 is identical in all substantive respects for purposes of the discussion herein to the structure illustrated in FIG. 1C, except that gate electrode finger 134 extends continuously under first insulation material layer 152. End leakage is sometimes a problem in TFTs formed by the prior art fabrication process. For example, residual doped semiconductor material 165 disposed along the substantially vertical channel plug end sidewalls 163, 164 may remain after the etching steps to remove the exposed doped semiconductor material. Additionally, a dopant-contaminated area 167 may exist in intrinsic semiconductor material layer 154 that was in contact with the doped semiconductor layer at an earlier step of the fabrication process. Dopant-contaminated area 167 is typically disposed under channel plug end sidewalls 163, 164.

DETAILED DESCRIPTION OF THE INVENTION

Figure 2:
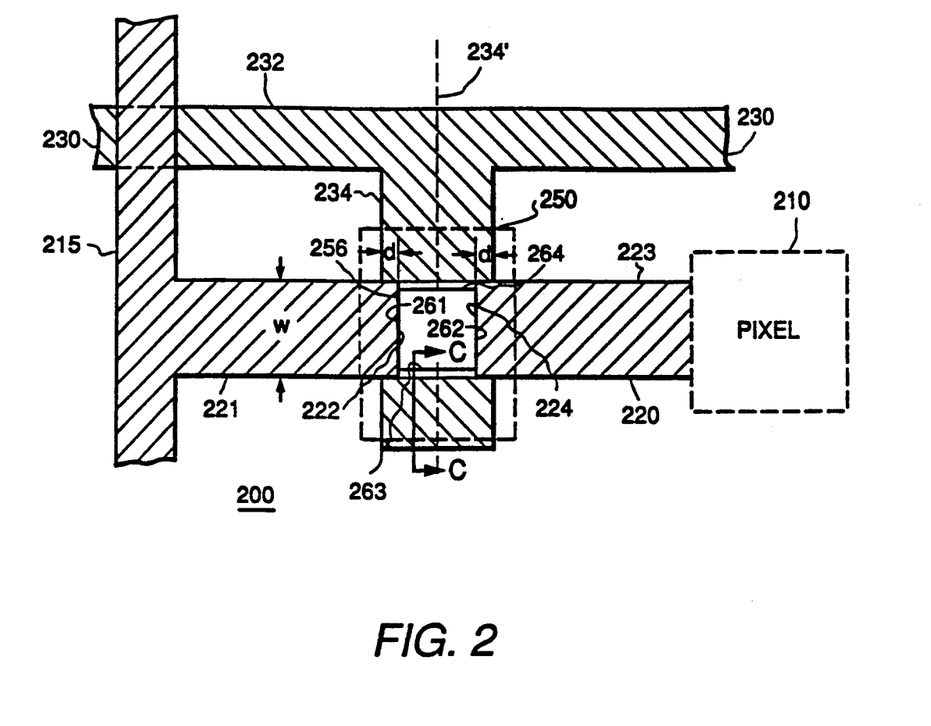
FIG. 2 is a plan view showing a portion of a TFT array following formation of a TFT body in accordance with this invention.

FIG. 2 illustrates a portion of an array 200 of pixels and associated electrical connections to the pixels fabricated in accordance with the present invention. The portion of the array depicted is representative of the whole array. The array comprises a pixel 210, a data line bus 215, a source/drain address line 220, a gate electrode 230, and a TFT body 250. The gate electrode and the source/drain address line are also commonly referred to as scan and data lines, respectively.

FIGS. 3A–3G illustrate steps of fabricating a TFT having reduced end leakage in accordance with the method of this invention, and represent various stages in fabricating TFT body 250 shown in FIG. 2, taken across lines C—C. A gate electrode 232, shown in FIG. 2, having a gate electrode finger 234 is formed on a substrate 205, shown in FIGS. 3A–3G. Substrate 205 typically comprises an insulative material, such as glass or the like. The gate electrode may comprise a single conductive layer of a metal, such as titanium (Ti), chromium (Cr), tungsten (W), aluminum (Al), molybdenum (Mo), and the like, or may comprise a multilayer structure such as molybdenum over titanium, titanium over aluminum, molybdenum over chromium and the like, to provide good adhesion to substrate 205 and low electrical resistance. The side edges of gate electrode finger 234 are preferably tapered by known wet or dry etching techniques to improve the step coverage, over the electrode edges, of subsequently deposited layers of material. Gate electrode finger 234 preferably has a thickness between about 100 nm and 500 nm.

Figure 3A:
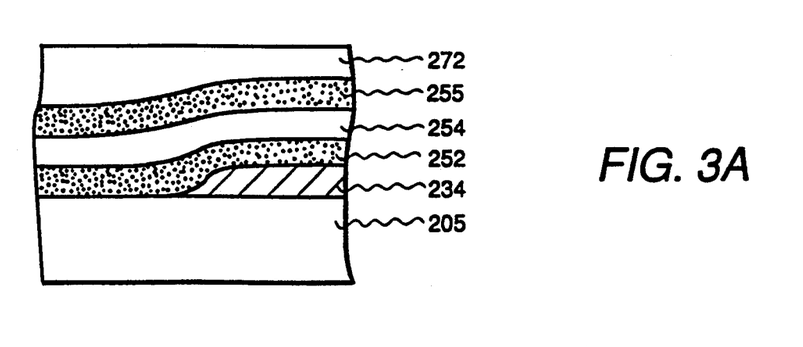
FIGS. 3A-3G are cross-sectional views of the steps of forming a TFT in accordance with this invention taken along line C—C in FIG. 2.

TFT body 250 (FIG. 2) is then formed over a portion of the gate electrode finger. The formation of the TFT body typically involves the following steps to produce a self-aligned TFT structure with source and drain electrode tips disposed at a selected overlap distance "d" over the gate electrode finger. As illustrated in FIG. 3A, first insulation material layer 252 having a thickness of about 150 nm to about 600 nm is deposited on substrate 205 and over gate electrode finger 234. A substantially intrinsic semiconductor material layer 254 having a thickness of about 50 nm is deposited over first insulation layer 252. Substantially intrinsic semiconductor material layer typically comprises hydrogenated amorphous silicon (a-Si:H) (also known as simply "amorphous silicon"), amorphous germanium (a-Ge), polycrystalline semiconductor material, or the like, deposited by a process such as plasma enhanced chemical vapor deposition (PECVD) and the like. A second insulation material layer 255 having a thickness between about 200 and about 600 nm is deposited over intrinsic semiconductor material layer 254. First and second insulation material layers advantageously comprise one or more layers of a amorphous hydrogenated silicon nitride (a-SiNx:H) (wherein x is in the range between about 1 and about 1.6, and the material is referred to herein as "silicon nitride"), amorphous hydrogenated silicon oxide (a-SiOy:H) (wherein y varies is within the range between about 1.7 to about 2.3, and the material is referred to herein as "silicon oxide") or other suitable dielectric material deposited by known techniques, such as PECVD and the like.

In accordance with the self-alignment technique, a channel plug 256 (FIG. 3B) is formed by depositing a first photoresist layer 272 (FIG. 3A) and patterning the photoresist layer to leave a segment overlying a portion of second insulation material layer 255 that is disposed above and within a selected distance from the sidewalls of gate electrode finger 234. Such patterning can be done, for example, by backside exposure techniques, i.e., exposing the photoresist layer from a light source disposed so that the light passes from the backside of the substrate surface, i.e., the surface opposite the substrate surface on which the TFT array structure is to be fabricated, through the substrate to expose the photoresist except where the light is blocked by the opaque gate electrode structure. The exposed photoresist is then removed to form a mask for patterning the source and drain electrode tips in the TFT array structure. This backside exposure procedure allows precise selection of the source/drain electrode tip overlap distance over the gate electrode finger. A front-exposure step (i.e., the light emanates from a source positioned so the light does not have to pass through the substrate to expose the photoresist and thus is not blocked by opaque structures on the substrate) is then used to pattern first photoresist layer 272 in areas overlying other portions of the gate electrode and gate electrode finger where it is desired to remove the photoresist in order to achieve the desired shape of the underlying second insulation material layer as described below. The exposed photoresist is removed to form the mask for etching the desired TFT structures.

Figure 3B:
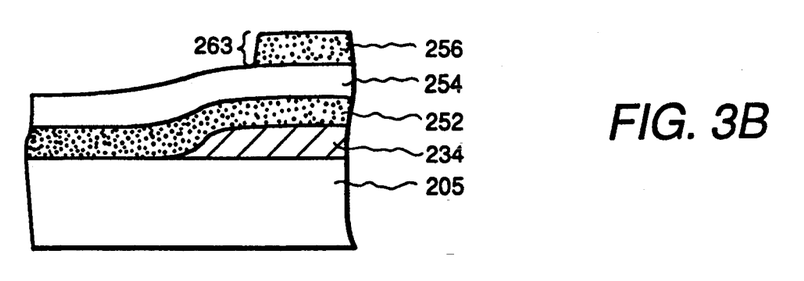

After first photoresist layer 272 has been patterned, the now-exposed portions of the second insulation layer 255 are etched by known etching techniques, such as etching with hydrofluoric acid, for example, to form channel plug 256, as illustrated in FIG. 3B. Channel plug 256 is substantially rectangular in shape, and is disposed over the gate electrode as illustrated in FIG. 2. Channel plug 256 has an end sidewall 263 (illustrated in FIG. 3B and FIG. 2), and an opposite end sidewall 264 (FIG. 2). Channel plug end sidewalls 263, 264 are oriented substantially perpendicular to longitudinal axis 234' of gate electrode finger 234. The two remaining sidewalls (not shown in the cross-section views of FIGS. 3A–3G) of channel plug 256 are electrode sidewalls 261, 262, disposed so as to respectively face source and drain electrode tips 222, 224 in the assembled device. These electrode sidewalls are oriented substantially parallel to the longitudinal axis of the gate electrode finger.

Figure 3C:
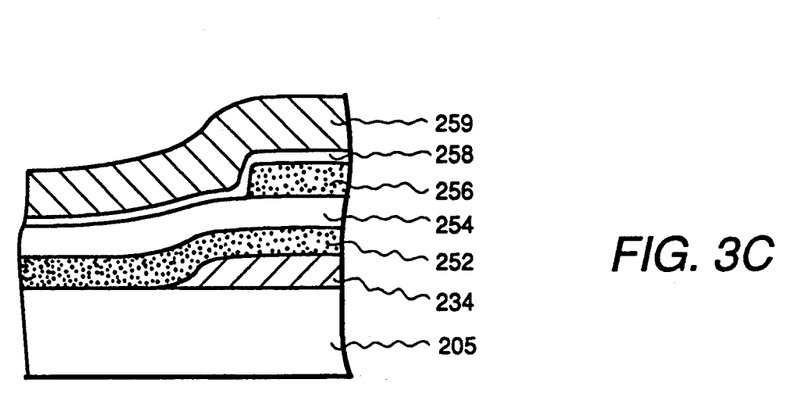

A doped semiconductor layer 258 is then deposited over channel plug 256 and the exposed portions of intrinsic semiconductor layer 254, as is shown in FIG. 3C. Alternatively, portions of intrinsic semiconductor layer 254 may be patterned prior to the deposition of the doped semiconductor layer. Doped semiconductor layer 258 contains a sufficient concentration of donor impurities so that it exhibits n+ type conductivity, such as is provided by heavy phosphorous doping of amorphous silicon, micro-crystalline silicon, or similar semiconductor material that is heavily donor-doped. The doped semiconductor material layer is deposited by conventional means, such as PECVD, for example, to a thickness between about 10 nm and 50 nm. A source/drain metallization layer 259 is then deposited over doped semiconductor layer 258. The source/drain metallization layer comprises a contact metal such as molybdenum (Mo), chromium (Cr) and the like; alternatively, two or more layers of such contact metals can be deposited to form the source drain metallization layer. Source/drain metallization layer 259 typically has a thickness between about 100 nm and 500 nm, and is deposited by sputtering or other known metal deposition techniques.

Source/drain metallization layer 259 is then selectively etched to remove the metal from above channel plug 256 and to expose the portion of the doped semiconductor layer overlying the channel plug. The selective etching of the source drain metallization layer is preferably accomplished by depositing a second photoresist layer (not shown), planarizing the photoresist, and non-selectively etching the photoresist to expose the top surface of the portion of the source/drain metallization layer disposed over the channel plug. The exposed portion of the source/drain metalization layer is then etched to expose the portion of the underlying doped semiconductor layer 258 disposed over the channel plug. The doped semiconductor layer is then etched so that the top surface of channel plug 256 is exposed.

Figure 3D:
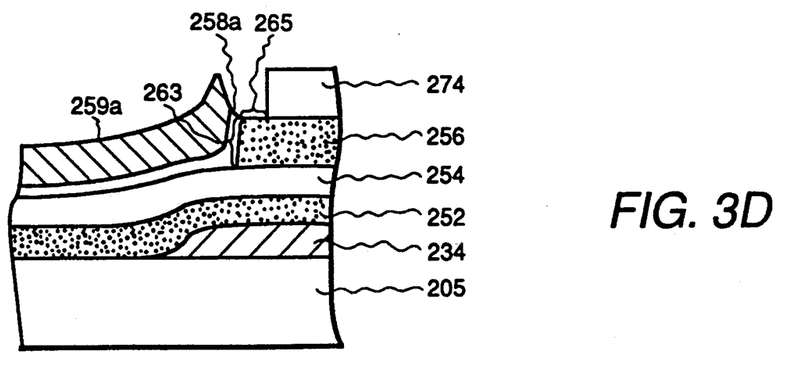

The removal of portions of source/drain metallization layer 259 by the aforementioned selective etching steps forms source and drain electrode tips 222, 224 respectively (FIG. 2), each of which is disposed within a respective selected overlap distance "d" over the gate electrode finger. A remaining portion of source/drain metallization layer 259a is disposed adjacent to each channel plug end sidewall; a representative one of the end sidewalls 263 is illustrated in FIG. 3D. The selective etching process also exposes a portion of doped semiconductor layer 258a adjacent to channel plug end sidewall 263.

A masking layer 274 (FIG. 3D) comprised of photoresist, for example, is then deposited and patterned to provide a mask for etching the remaining source/drain metallization layer to form a data line bus 215, a data connection address line 221, and a pixel connection line 223 (FIG. 2). In accordance with this invention, masking layer 274 is patterned to expose the channel plug end sidewalls and a portion of the channel plug adjoining the sidewalls. FIG. 3D illustrates a selected portion 265 of channel plug 256 adjoining end sidewall 263, which portion is to be removed. The size of selected portion 265 is chosen to ensure that substantially all of the channel plug end sidewall second insulation material 256 that was in contact with doped semiconductor layer 258 is removed in the etching steps described below. Similarly, a corresponding portion of the second insulation material adjoining the opposite end sidewall is exposed (not shown in cross-section). The size of selected portion 265 is also chosen to be consistent with the alignment accuracy of the photoresist exposure apparatus used to pattern photoresist layer 274. The patterned photoresist 274 forms a mask that does not cover the end 263 of the channel plug region near the region 258a of doped semiconductor material layer 258 so as to ensure that region 258a can be etched away and so that the material in channel plug end 263 exposed to the n+ semiconductor material can be etched. Otherwise, the size of portion 265 is preferably made as small as practical to minimize the total device size. Typically, photoresist masking layer 274 is also patterned to expose an area of the top surface of channel plug 256 that lies outside the width boundaries "w" of source/drain address line 220 (FIG. 2). Masking layer 274 extends over channel plug electrode sidewalls 261, 262, the source and drain electrode tips 222, 224, and the doped semiconductor material disposed respectively between them. Patterned masking layer 274 is advantageously also patterned to be used when etching the source/drain metallization layer to form source/drain address line 220. The portions of source/drain metallization layer 259 exposed by patterned masking layer 274 are then etched to remove the metallization layer except where it is desired to be retained to form the address connection line and pixel connection lines for the source and drain electrode tips.

Figure 3E:
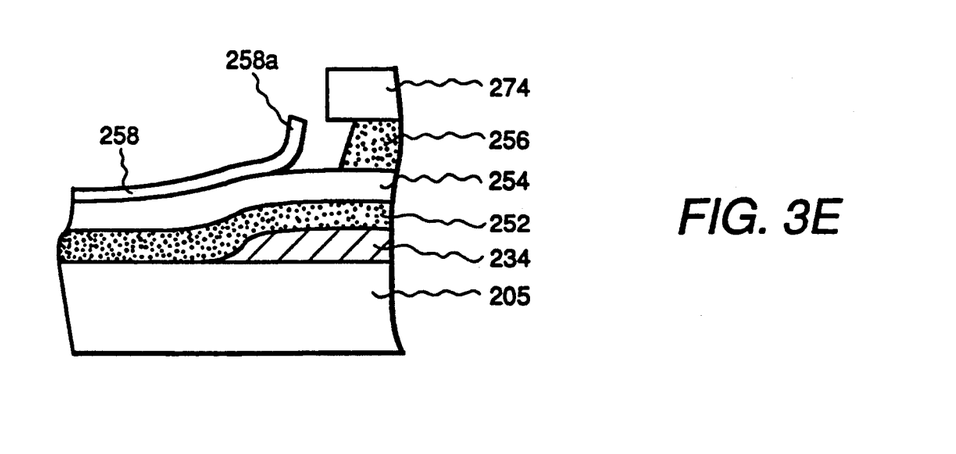

In accordance with this invention, channel plug 256 is next selectively etched to remove the second insulation material disposed adjacent to the doped semiconductor material layer. As used herein, "adjacent to the doped semiconductor layer" refers to that portion of the channel plug second insulation material layer that is in contact with the doped semiconductor material at some point in the fabrication process. Thus, even if it is found to be desirable to etch away the source/drain metallization and the doped semiconductor material before etching the channel plug, the portion of the channel plug formerly in contact with the doped semiconductor material is etched away by the channel plug etchant. If the second insulation material layer is silicon nitride or silicon oxide, it may be etched, for example, by buffered hydrofluoric acid (BHF) or hydrofluoric acid (HF). This step typically results in some undercutting of the channel plug under patterned mask layer 274, as is shown in FIG. 3E. Consequently, in the finished device, the width of the channel plug (i.e., the distance between the two channel plug end sidewalls) may be somewhat less than the width of the address connection line and the pixel connection line, both of which are formed from the same mask (patterned photoresist layer 274), albeit through an etching process that does not cause as much undercutting in the source/drain metallization layer. Alternatively, this step of selectively etching the second insulation material comprising the channel plug can be accomplished prior to etching the source/drain metallization layer exposed by patterned masking layer 274.

Figure 3F:
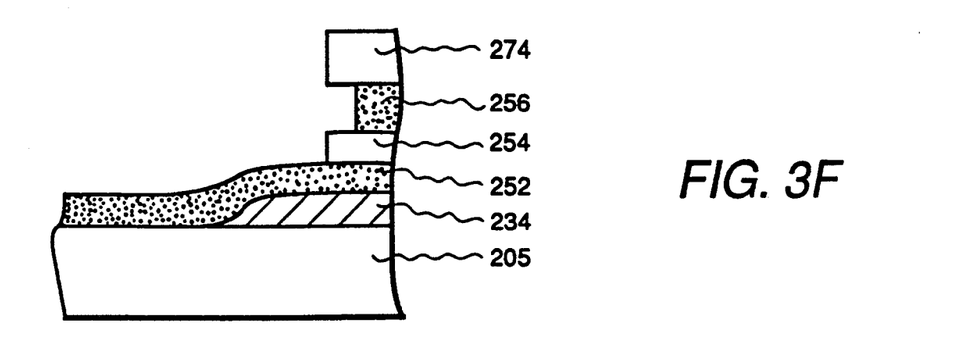
Figure 3G:
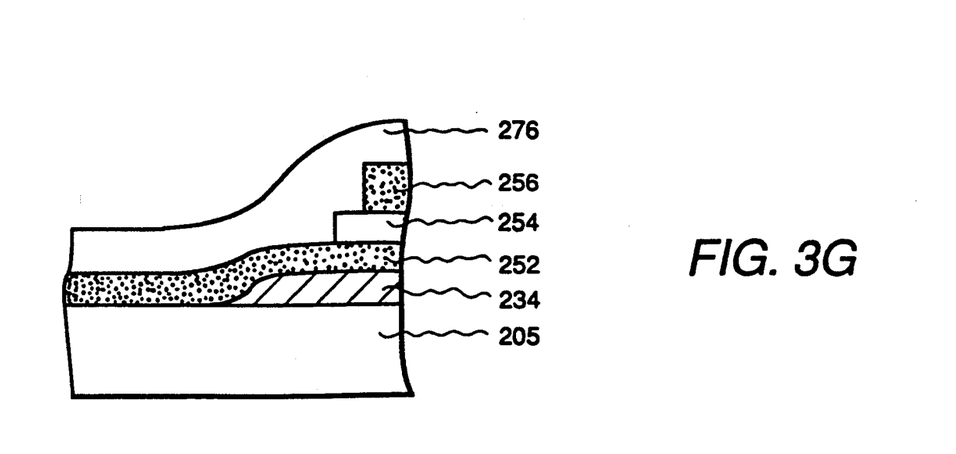

The portion of doped semiconductor layer 258 left exposed by patterned masking layer 274 is then etched, preferably using known reactive ion etching (RIE) techniques. Patterned masking layer 274 is advantageously left in place during this etching step to ensure that the doped semiconductor material disposed between the source electrode tip and the channel plug and the drain electrode tip and the channel plug is not etched. In accordance with this invention, intrinsic semiconductor material layer 254 is then selectively etched, preferably using known RIE techniques. This etching step removes the intrinsic semiconductor material that is not underlying patterned mask layer 274, such that at least the portion of the intrinsic semiconductor material formerly covered by doped semiconductor material layer 258 is removed, as is illustrated in FIG. 3F. The patterned masking layer 274 is then removed and the TFT body and adjoining areas of the array are advantageously covered with a passivation layer 276, such as silicon oxide, for example, creating the structure illustrated in FIG. 3G.

The etching of the channel plug end sidewalls that were previously covered by the doped semiconductor material and the removal of the intrinsic semiconductor material that had been in contact with the doped semiconductor material produces a TFT body with reduced end leakage. The TFT body formed in accordance with this invention also retains the desired precise alignment of the source and drain electrode tips over the gate electrode as illustrated in FIG. 2.

The device formed by this method thus has the advantages of the precise self-aligned source and drain electrode tip overlap and additionally exhibits relatively small end leakage currents because the portions of the channel plug and the underlying intrinsic semiconductor layer that were in contact with the doped semiconductor material during a portion of the fabrication process have been removed in forming the completed device.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of forming a low end leakage thin film transistor, comprising the steps of:
   forming a gate electrode on a substrate, said electrode comprising a gate electrode finger extending along a longitudinal axis and terminating in a gate electrode tip;
   forming a thin film transistor (TFT) body disposed over said gate electrode finger, said TFT body including: a first insulation material layer, an intrinsic semiconductor material layer disposed on said first insulation layer, a channel plug comprising an insulation material situated on said intrinsic semiconductor material layer and disposed over at least a portion of said gate electrode finger, said channel plug having opposing first and second electrode sidewalls, each electrode sidewall being aligned substantially parallel with the gate electrode finger longitudinal axis, and further having opposing first and second channel plug end sidewalls, each plug end sidewall being substantially perpendicular to the gate electrode finger longitudinal axis, a doped semiconductor material layer disposed over said intrinsic semiconductor material layer and said channel plug electrode and end sidewalls, and a source/drain metallization layer disposed over said doped semiconductor layer and shaped so as not to cover said channel plug, said source/drain metallization layer including a source electrode tip and a drain electrode tip, each of said tips respectively terminating substantially adjacent to a respective one of said first and second channel plug electrode sidewalls, said doped semiconductor layer being disposed between said source and drain electrode tips and the corresponding one of said first and second channel plug electrode sidewalls;
   selectively etching said source/drain metallization layer to form a data address connection line and a pixel connection line coupled to a respective one of said source electrode tip and said drain electrode tip;
   removing substantially all of the insulation material of said first and second channel plug end sidewalls disposed adjacent to said doped semiconductor material;
   removing said doped semiconductor material layer exposed by the removal of the etched source/drain metallization layer; and
   removing at least the intrinsic semiconductor material formerly in contact with said doped semiconductor material.

2. The method of claim 1 wherein the step of selectively etching said source/drain metallization layer further comprises the steps of:
   depositing a mask layer on said source/drain metallization layer;
   patterning said mask layer to expose selected portions of said source/drain metallization layer; and
   etching the exposed source/drain metallization layer to form said address connection line and said pixel connection line.

3. The method of claim 2 wherein the step of removing substantially all of the second insulation material of said first and second channel plug sidewalls further comprises:
   masking said TFT body such that at least the portion of said channel plug and said doped semiconductor material layer disposed between said source and drain electrode tips is covered by the mask; and
   etching the exposed portions of said channel plug.

4. The method of claim 3 wherein the step of removing said doped semiconductor material comprises selectively etching said doped semiconductor material.

5. The method of claim 4 wherein the step of removing at least the intrinsic semiconductor material formerly in contact with said doped semiconductor material comprises selectively etching said intrinsic semiconductor material.

6. The method of claim 3 wherein the steps of removing said doped semiconductor material and removing said intrinsic semiconductor material takes place through a single mask in common.

7. The method of claim 6 wherein said second insulation material is selected from the group consisting of silicon nitride and silicon oxide.

8. The method of claim 7 wherein the step of selectively etching said channel plug comprises exposing said channel plug to an etchant selected from the group of hydrofluoric acid and buffered hydrofluoric acid.

9. The method of claim 8 wherein the steps of selectively etching said doped semiconductor material layer exposed by the removal of the source/drain metallization and selectively etching said intrinsic semiconductor material each comprises reactive ion etching.

10. The method of claim 9 wherein said doped semiconductor material layer comprises amorphous silicon exhibiting n-type conductivity or micro-crystalline silicon exhibiting n-type conductivity.

11. The method of claim 9 wherein said intrinsic semiconductor material comprises intrinsic amorphous silicon.

12. The method of claim 1 further comprising the step of depositing a passivation layer over the TFT body following the selective etching of the intrinsic semiconductor material layer.

* * * * *